United States Patent
Park et al.

(10) Patent No.: US 7,919,006 B2
(45) Date of Patent: Apr. 5, 2011

(54) METHOD OF ANTI-STICTION DIMPLE FORMATION UNDER MEMS

(75) Inventors: Woo Tae Park, Chandler, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 725 days.

(21) Appl. No.: 11/932,099

(22) Filed: Oct. 31, 2007

(65) Prior Publication Data

US 2009/0111267 A1    Apr. 30, 2009

(51) Int. Cl.
*C03C 15/00* (2006.01)
*H01L 21/302* (2006.01)

(52) U.S. Cl. ............... 216/88; 216/2; 216/89; 438/692

(58) Field of Classification Search .......... 216/2, 88, 216/89; 438/692
See application file for complete search history.

(56) References Cited

U.S. PATENT DOCUMENTS

| | | | |
|---|---|---|---|
| 5,696,406 A * | 12/1997 | Ueno | 257/784 |
| 5,919,548 A * | 7/1999 | Barron et al. | 428/138 |
| 6,402,968 B1 * | 6/2002 | Yazdi et al. | 216/2 |
| 6,538,798 B2 | 3/2003 | Miller et al. | |
| 6,859,577 B2 | 2/2005 | Lia | |
| 6,876,046 B2 | 4/2005 | Prophet | |
| 7,122,395 B2 | 10/2006 | Gogoi | |
| 2005/0003566 A1 * | 1/2005 | Yamamoto | 438/22 |
| 2008/0153251 A1 * | 6/2008 | Kostrzewa et al. | 438/406 |

* cited by examiner

*Primary Examiner* — Shamim Ahmed
(74) *Attorney, Agent, or Firm* — Daniel D. Hill; Michael J. Balconi-Lamica

(57) ABSTRACT

A method for making a MEMS structure comprises patterning recesses in a dielectric layer overlying a substrate, each recess being disposed between adjacent mesas of dielectric material. A conformal layer of semiconductor material is formed overlying the recesses and mesas. The conformal layer is chemical mechanically polished to form a chemical mechanical polished surface, wherein the chemical mechanical polishing is sufficient to create dished portions of semiconductor material within the plurality of recesses. Each dished portion has a depth proximate a central portion thereof that is less than a thickness of the semiconductor material proximate an outer portion thereof. A semiconductor wafer is then bonded to the chemical mechanical polished surface. The bonded semiconductor wafer is patterned with openings according to the requirements of a desired MEMS transducer. Lastly, the MEMS transducer is released. Releasing advantageously exposes anti-stiction features formed from outer edges of the dished portion of semiconductor material.

20 Claims, 4 Drawing Sheets

METHOD OF ANTI-STICTION DIMPLE FORMATION UNDER MEMS

BACKGROUND

1. Field

This disclosure relates generally to MEMS devices, and more specifically, to a method of anti-stiction dimple formation under MEMS.

2. Related Art

Micromachined Electrical Mechanical Switches (MEMS) suffer from a phenomenon referred to as 'stiction' in MEMS devices. Stiction occurs when the microstructure of the MEMS device is brought to an 'intimate contact' with a surrounding surface. Once in contact, Van der Waals force or hydrogen bonding on the surface exceeds the restoring spring force of the MEMS structure, undesirably resulting in a permanent stiction. In addition, such a stiction bonding force increases as the contact area increases.

Dimples under MEMS devices are known in the art; however, the methods of creating dimples are different. For example, in one method, dimples have been made by a patterning and etching of dimple material used to form dimple contact areas. However, such direct patterning and etching of the dimple material results in dimples larger than desired or useful. In another method, dimples are formed on springs for an SOI based optical MEMS; however, such a method does not provide a method to create dimples under an SOI MEMS structure. In yet another method, dimples are created by depositing polysilicon after a partial release of the MEMS structure. The later method is undesirable, as it requires extra processing steps for dimple formation.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

According to the embodiments of the present disclosure, a method is disclosed for creating anti-stiction dimples under a MEMS structure. In one embodiment, silicon dimples are created by utilizing a 'dishing effect' during a chemical mechanical polishing (CMP) process of planarizing two different materials. The 'weaker' material to the specific slurry used, gets 'dished' in some amount during the planarization process. As a result, the sharp edges of the dished region provides for creating anti-stiction dimples subsequent to exhausting of the surrounding material during a microstructure release step, as discussed herein.

Furthermore, the dimple structures are created by a CMP process. In other words, CMP is used for in the process of dimple formation for creating anti-stiction features under MEMS, and more particularly, high aspect ratio MEMS. The method further includes using bonded single crystal silicon, for example, semiconductor on insulator (SOI) type. As a result, no additional process steps are needed for dimple formation. The dimple structure of polysilicon under the MEMS structure can advantageously serve as an electrode, conductive path or paths, and one or more mechanical anti-stiction dimples, all formed in the same process.

Figure 1:
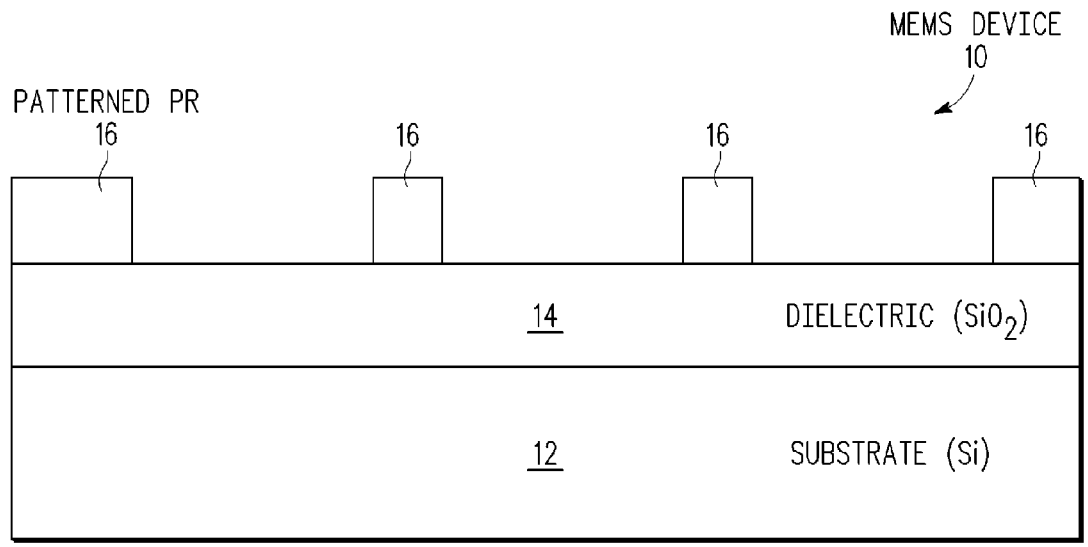
FIGS. 1-6 are partial cross-sectional views of a MEMS device having anti-stiction features thereof at various stages of manufacture according to one embodiment of the present disclosure.

FIGS. 1-6 are partial cross-sectional views of a MEMS device having anti-stiction features thereof at various stages of manufacture according to one embodiment of the present disclosure. Turning now to FIG. 1, formation of MEMS device 10 begins with a handle wafer 12 having a dielectric layer 14 overlying a top surface thereof. In one embodiment, the handle wafer 12 comprises a silicon wafer and the dielectric layer 14 comprises silicon dioxide. A photoresist or masking layer is disposed overlying the dielectric layer 14 and patterned to provide a patterned photoresist 16.

Figure 2:
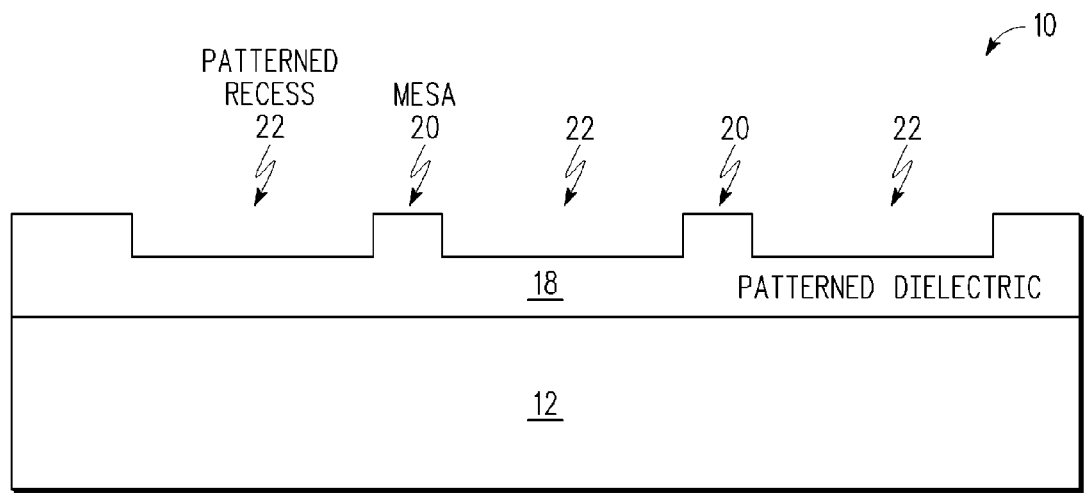

In FIG. 2, the structure of FIG. 1 is etched through openings in the patterned photoresist 16, using a suitable etchant, to produce a patterned dielectric 18 from dielectric layer 14. Patterned dielectric 18 is characterized by a number of raised mesas 20 and patterned recesses 22 disposed in-between adjacent ones of the raised mesas 20, all within a desired region or area of dielectric layer 14. In other words, for a top down view (not shown) the patterned dielectric 18 is characterized as having a single patterned recess with a plurality of raised mesas within the recess. Etching of the dielectric layer 14 can be accomplished using suitable etchant techniques known in the art. The patterned recesses 22 are of a depth sufficient for producing a desired height anti-stiction feature, as will be discussed further herein.

Figure 3:
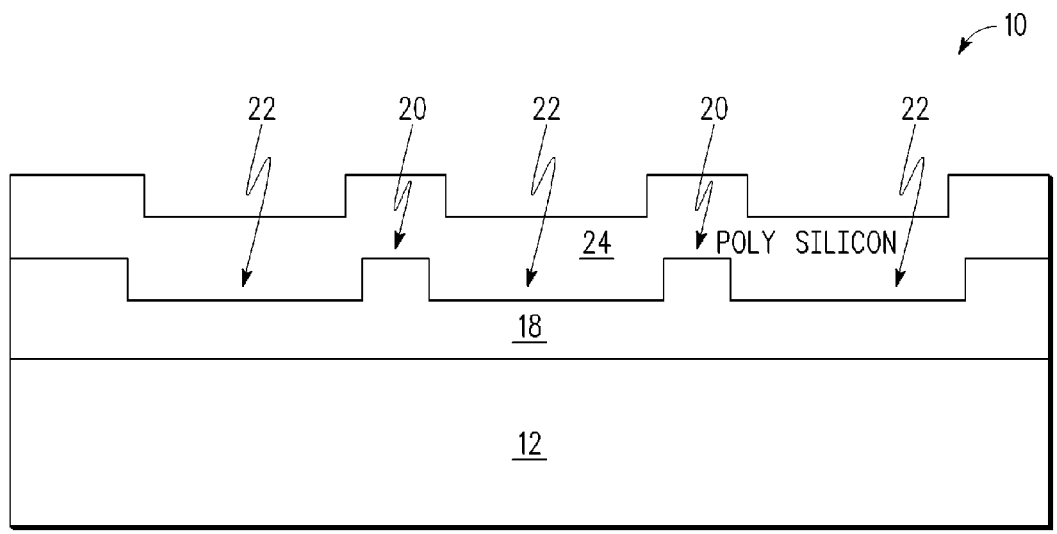

In FIG. 3, a conformal semiconductor layer 24 is formed overlying the patterned dielectric 18. In particular, the conformal deposition of semiconductor layer 24 is at least sufficient to completely fill the patterned recesses 22 between the raised mesas 20. In one embodiment, the conformal semiconductor layer 24 comprises polysilicon. Conformal deposition of semiconductor layer 24 can be accomplished using techniques known in the art.

Figure 4:
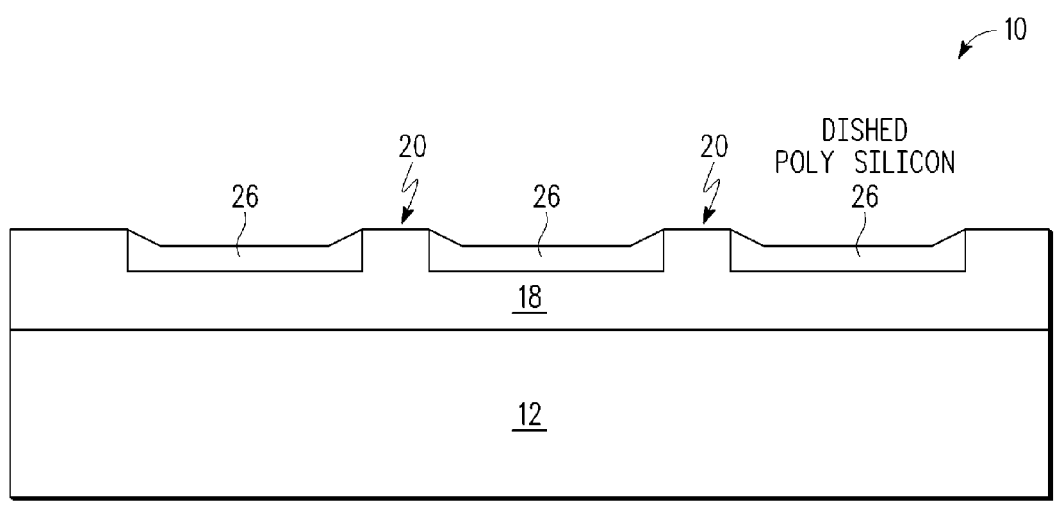

In FIG. 4, the wafer structure of FIG. 3, and in particular, semiconductor layer 24 is etched back using chemical mechanical polishing techniques. That is, the semiconductor layer 24 is subjected to chemical mechanical polishing until substantially all of the semiconductor material of layer 24 is removed with the exception that a portion of the material remains within the patterned recesses 22 of patterned dielectric 18. In particular, the material of semiconductor layer 24 remaining within the patterned recesses 22 is characterized as having a dished shape, or being slightly recessed within a central portion thereof. The dished shaped semiconductor material is indicated by reference numeral 26. Furthermore, the central portion of the dished shaped semiconductor material 26 within patterned recesses 22 is shallower in depth than outer portions of the dished shaped semiconductor material 26 at the edges of the patterned recesses 22, adjacent to a corresponding mesa 20. The raised portions of the dished semiconductor material 26 at the edges of the patterned recesses 22 advantageously provides for formation of anti-stiction features, as is discussed further herein. In one embodiment, dishing of the semiconductor material is on the order of 1-50% of the total thickness of the semiconductor material within a recess. In other words, the central portion of the dished shaped semiconductor material 26 is shallower in depth that outer portions of the semiconductor material at the edges of a recess by 1-50%. Chemical mechanical polishing techniques are known in the art and thus only discussed briefly herein.

Figure 5:
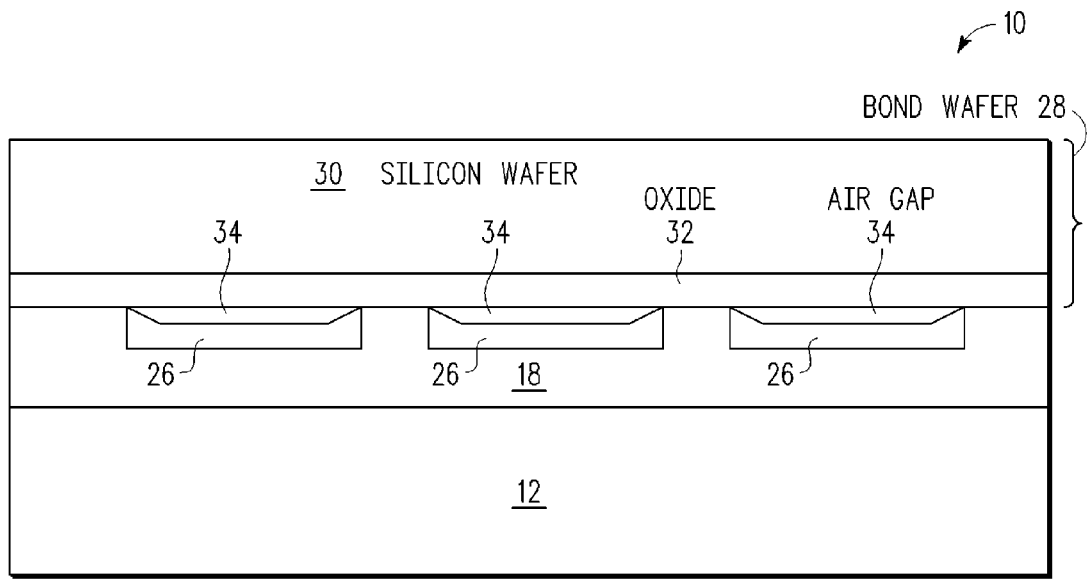

In FIG. 5, a bond wafer 28 comprising a semiconductor wafer 30 having a dielectric layer 32 on a surface thereof is bonded, using suitable wafer bonding techniques, to the structure of FIG. 4. In one embodiment, semiconductor wafer 30 comprises a silicon wafer and the dielectric layer 32 comprises oxide. In particular, the dielectric layer 32 bonds to exposed portions of the mesas 20 of the patterned dielectric 18. Furthermore, bonding of wafer 28 to the structure of FIG. 4 creates air gaps 34 between the dished shaped material 26 and the overlying dielectric layer 32 of the bond wafer 28. Moreover, the bonded semiconductor wafer 30 becomes the transducer layer of the MEMS device 10.

Figure 6:
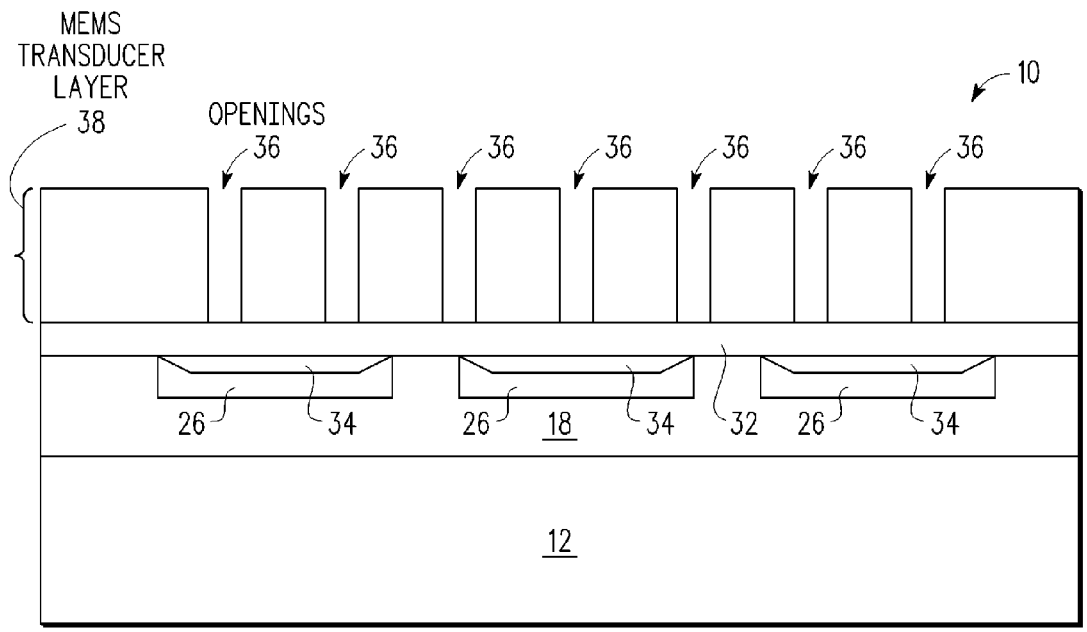

In FIG. 6, semiconductor layer 30 is patterned and etched, using suitable lithographic techniques, to form openings 36, further according to the particular requirements of the transducer layer 38 for the MEMS device 10. Openings 36 preferably extend from a top surface of layer 30 and through the semiconductor layer to expose corresponding regions on a top surface of dielectric layer 32, as shown in FIG. 6.

Figure 7:
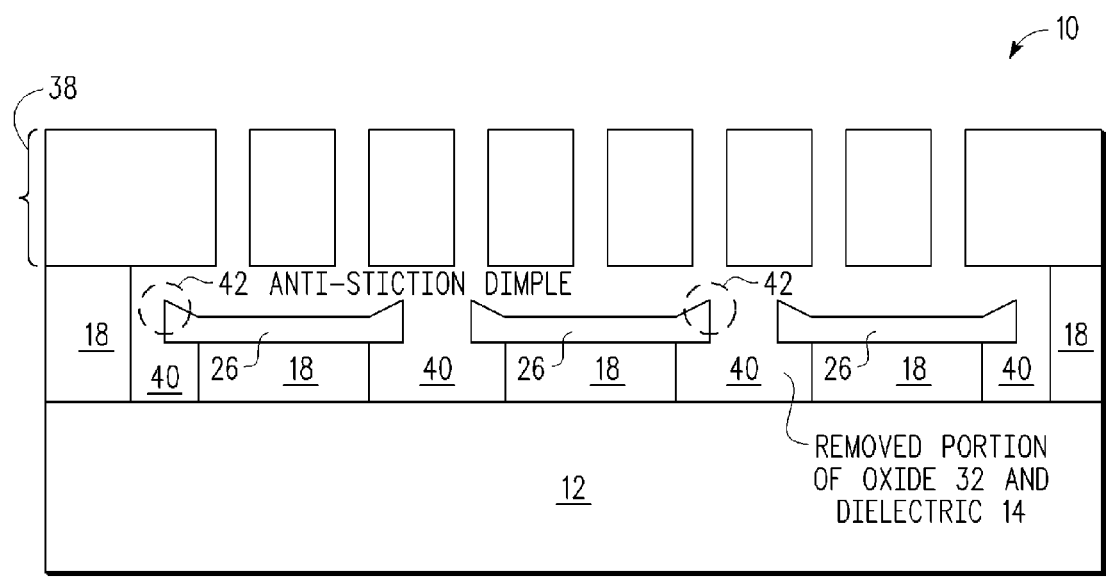
FIG. 7 is partial cross-sectional view of a MEMS device having anti-stiction features thereof made according to one embodiment of the present disclosure.

In FIG. 7, the structure is subjected to an appropriate etch for releasing relevant portions of the MEMS transducer layer 38 and forming cavities generally indicated by reference numeral 40. In one embodiment, the structure of FIG. 6 is subjected to a timed etch of sufficient duration to release the relevant portions of the MEMS structures and, in addition, to expose the anti-stiction features, some of which are indicated by the reference numeral 42 in FIG. 7. In particular, the anti-stiction features 42 comprise dimples extending in an upward direction towards the released transducer layer 38. In other words, the anti-stiction features are characterized as having a hollowed out conical shape centered about the location of a previously existing raised mesa, with the tip of the conical shape pointing in the direction of the overlying MEMS transducer layer. Furthermore, the dimples provide anti-stiction points (via the tip of the conical shape) on a corresponding electrical pad. In FIG. 7, the cross-sectional view shows one example of three portions (in cross-section indicated by reference numeral 26) of one electrical pad, with an anti-stiction dimple between adjacent portions of the electrical pad (two full dimples are in the center between corresponding ones of the adjacent regions 26, one half dimple is to the left-hand side of the left-most portion 26, and another half dimple is to the right-hand side of the right-most portion 26). In a perspective view (not shown), the anti-stiction dimples could include any number of anti-stiction dimples arranged in a predefined pattern (e.g., a grid pattern or the like) and appearing across the top surface of the electrical pad, according to the requirements of the particular MEMS device. In one embodiment, the anti-stiction features 42 comprise polysilicon dimples. The polysilicon dimples advantageously serve as both electrical as well as mechanical anti-stiction dimples. FIG. 7 thus illustrates a partial cross-sectional view of MEMS device 10 having anti-stiction features thereof made according to one embodiment of the present disclosure.

The substrates, as discussed herein, can comprise any semiconductor material or combinations of materials, such as gallium arsenide, gallium nitride, silicon germanium, silicon-on-insulator (SOI), silicon, monocrystalline silicon, or glass, ceramic, the like, and combinations of the above.

By now it should be appreciated that there has been provided a method for making a MEMS structure comprises patterning a plurality of recesses in a dielectric layer overlying a substrate, each recess being disposed between adjacent mesas of dielectric material of the dielectric layer. A conformal layer of semiconductor material is formed overlying the plurality of recesses and mesas. The conformal layer is chemically mechanically polished to form a chemical mechanical polished surface, the chemical mechanical polishing being sufficient to create dished portions of semiconductor material within the plurality of recesses, each dished portion having a depth proximate a central portion thereof that is less than a thickness of the semiconductor material proximate an outer portion thereof. A semiconductor wafer is wafer bonding to the chemical mechanical polished surface. The bonded semiconductor wafer is patterned with openings according to the requirements of a desired MEMS transducer. The MEMS transducer is thereafter released.

Patterning the plurality of recesses can include patterning an oxide layer overlying a silicon substrate. Forming the conformal layer can comprise forming a conformal layer of polysilicon. The conformal layer can further comprise a conformal layer having a thickness at least sufficient to fill the plurality of recesses. The depth proximate a central region of the dished portion of semiconductor material is on the order of one to fifty percent of the thickness of the dished portion of the semiconductor material proximate an outer region thereof. Releasing the MEMS transducer can include etching exposed dielectric material through the openings in the bonded semiconductor wafer sufficient to release the MEMS transducer. In addition, the etching includes exposing anti-stiction features formed from outer edges of the dished portions of semiconductor material. In one embodiment, the anti-stiction features comprise dimples. In addition, the releasing includes using a timed etch.

According to another embodiment, a method for making a MEMS structure, comprises patterning a plurality of recesses in a dielectric layer overlying a substrate, each recess being disposed between adjacent mesas of dielectric material of the dielectric layer; forming a conformal layer of semiconductor material overlying the plurality of recesses and mesas; chemical mechanical polishing the conformal layer to form a chemical mechanical polished surface, the chemical mechanical polishing being sufficient to create dished portions of semiconductor material within the plurality of recesses, each dished portion having a depth proximate a central portion thereof that is less than a thickness of the semiconductor material proximate an outer portion thereof; wafer bonding a semiconductor wafer to the chemical mechanical polished surface; patterning the bonded semiconductor wafer with openings according to the requirements of a desired MEMS transducer; and releasing the MEMS transducer.

In one embodiment, the bonded semiconductor wafer includes a semiconductor transducer layer and a dielectric layer on a surface thereof for bonding with the chemical mechanical polished surface. In another embodiment, wafer bonding creates air gaps overlying individual ones of the dished portions of semiconductor material within the plurality of recesses. In a further embodiment, releasing the MEMS transducer includes etching exposed dielectric material through the openings in the bonded semiconductor wafer sufficient to release the MEMS transducer. Etching further includes exposing anti-stiction features formed from outer edges of the dished portions of semiconductor material. The anti-stiction features comprise dimples.

In a further embodiment, a method for making a MEMS structure comprises patterning a plurality of recesses in an oxide layer overlying a silicon substrate, each recess being disposed between adjacent mesas of material of the oxide layer; forming a conformal layer of polysilicon overlying the plurality of recesses and mesas; chemical mechanical polishing the conformal polysilicon layer to form a chemical mechanical polished surface, the chemical mechanical polishing being sufficient to create dished portions of polysilicon material within the plurality of recesses, each dished portion having a depth proximate a central portion thereof that is less than a thickness of the polysilicon material proximate an outer portion thereof; wafer bonding a silicon wafer having an oxide surface overlying the silicon wafer to the chemical mechanical polished surface; patterning the silicon of bonded semiconductor wafer with openings according to the requirements of a desired MEMS transducer; and releasing the MEMS transducer, wherein releasing includes etching exposed oxide material through the openings in the bonded silicon wafer sufficient to release the MEMS transducer, wherein the etching further includes exposing anti-stiction features formed from outer edges of the dished portions of polysilicon material.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can also be advantageously applied to MEMS x-axis gyroscopes, SOI based MEMS, MEMS sensors, SMARTMOS, and the like. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a MEMS structure, comprising:
    patterning a plurality of recesses in a dielectric layer overlying a substrate, each recess being disposed between adjacent mesas of dielectric material of the dielectric layer;
    forming a conformal layer of semiconductor material overlying the plurality of recesses and mesas;
    chemical mechanical polishing the conformal layer to form a chemical mechanical polished surface, the chemical mechanical polishing being sufficient to create dished portions of semiconductor material within the plurality of recesses;
    wafer bonding a semiconductor wafer to the chemical mechanical polished surface;
    patterning the bonded semiconductor wafer with openings formed over the dished portions of semiconductor material; and
    releasing the MEMS transducer.

2. The method of claim 1, wherein patterning the plurality of recesses includes patterning an oxide layer overlying a silicon substrate.

3. The method of claim 2, wherein forming the conformal layer comprises forming a conformal layer of polysilicon.

4. The method of claim 3, wherein the conformal layer comprises a conformal layer having a thickness at least sufficient to fill the plurality of recesses.

5. The method of claim 4, wherein a depth of the dished portion of semiconductor material is on the order of one to fifty percent of a thickness of the semiconductor material within the plurality of recesses.

6. The method of claim 5, wherein releasing the MEMS transducer includes etching exposed dielectric material through the openings in the bonded semiconductor wafer sufficient to release the MEMS transducer.

7. The method of claim 6, wherein the etching includes exposing anti-stiction features formed from outer edges of the dished portions of semiconductor material.

8. The method of claim 7, wherein the anti-stiction features comprise dimples.

9. The method of claim 8, wherein the releasing includes using a timed etch.

10. A method for making a MEMS structure, comprising:
    patterning a plurality of recesses in a dielectric layer overlying a substrate, each recess being disposed between adjacent mesas of dielectric material of the dielectric layer;
    forming a conformal layer of semiconductor material overlying the plurality of recesses and mesas;
    chemical mechanical polishing the conformal layer to form a chemical mechanical polished surface, the chemical mechanical polishing being sufficient to create dished portions of semiconductor material within the plurality of recesses of;
    wafer bonding a semiconductor wafer to the chemical mechanical polished surface;
    patterning the bonded semiconductor wafer with openings formed over the dished portions of semiconductor material; and
    releasing the MEMS transducer.

11. The method of claim 10, wherein patterning the plurality of recesses includes patterning an oxide layer overlying a silicon substrate.

12. The method of claim 11, wherein forming the conformal layer comprises forming a conformal layer of polysilicon.

13. The method of claim 10, wherein the conformal layer comprises a conformal layer having a thickness at least sufficient to fill the plurality of recesses.

14. The method of claim 10, wherein a depth of the dished portion of semiconductor material is on the order of one to fifty percent of a thickness of semiconductor material within the plurality of recesses.

15. The method of claim 10, wherein the bonded semiconductor wafer includes a semiconductor transducer layer and a dielectric layer on a surface thereof for bonding with the chemical mechanical polished surface.

16. The method of claim 10, wherein wafer bonding creates air gaps overlying individual ones of the dished portions of semiconductor material within the plurality of recesses.

17. The method of claim 10, wherein releasing the MEMS transducer includes etching exposed dielectric material through the openings in the bonded semiconductor wafer sufficient to release the MEMS transducer.

18. The method of claim 17, wherein the etching further includes exposing anti-stiction features formed from outer edges of the dished portions of semiconductor material.

19. The method of claim 18, wherein the anti-stiction features comprise dimples.

20. A method for making a MEMS structure, comprising:
patterning a plurality of recesses in an oxide layer overlying a silicon substrate, each recess being disposed between adjacent mesas of material of the oxide layer;
forming a conformal layer of polysilicon overlying the plurality of recesses and mesas;
chemical mechanical polishing the conformal polysilicon layer to form a chemical mechanical polished surface, the chemical mechanical polishing being sufficient to create dished portions of polysilicon material within the plurality of recesses;
wafer bonding a silicon wafer having an oxide surface overlying the silicon wafer to the chemical mechanical polished surface;
patterning the silicon of bonded semiconductor wafer with openings formed over the dished portions of the semiconductor material; and
releasing the MEMS transducer, wherein releasing includes etching exposed oxide material through the openings in the bonded silicon wafer sufficient to release the MEMS transducer, wherein the etching further includes exposing anti-stiction features formed from outer edges of the dished portions of polysilicon material.

* * * * *